US010169216B2

(12) United States Patent
Shani et al.

(10) Patent No.: US 10,169,216 B2
(45) Date of Patent: Jan. 1, 2019

(54) SIMULATING SENSORS

(71) Applicant: HEWLETT-PACKARD DEVELOPMENT COMPANY, L.P., Houston, TX (US)

(72) Inventors: Inbar Shani, Yehud (IL); Amichai Nitsan, Yehud (IL); Sigal Maon, Yehud (IL)

(73) Assignee: ENTIT SOFTWARE LLC, Sunnyvale, CA (US)

( * ) Notice: Subject to any disclaimer, the term of this patent is extended or adjusted under 35 U.S.C. 154(b) by 103 days.

(21) Appl. No.: 14/898,534

(22) PCT Filed: Jun. 28, 2013

(86) PCT No.: PCT/US2013/048567
§ 371 (c)(1),
(2) Date: Dec. 15, 2015

(87) PCT Pub. No.: WO2014/209362
PCT Pub. Date: Dec. 31, 2014

(65) Prior Publication Data
US 2016/0132424 A1 May 12, 2016

(51) Int. Cl.
G06F 11/00 (2006.01)
G06F 11/36 (2006.01)
G09B 19/24 (2006.01)
G06F 17/50 (2006.01)

(52) U.S. Cl.
CPC ...... *G06F 11/3684* (2013.01); *G06F 11/3688* (2013.01); *G06F 17/5009* (2013.01); *G09B 19/24* (2013.01)

(58) Field of Classification Search
CPC .... G06F 9/44; G06F 9/44536; G06F 11/3664; G06F 17/5022
See application file for complete search history.

(56) References Cited

U.S. PATENT DOCUMENTS

| 3,436,840 | A | * | 4/1969 | Noxon | G06E 3/001 359/633 |
| 5,784,615 | A | * | 7/1998 | Lipe | G06F 9/4425 712/E9.082 |
| 5,826,265 | A | * | 10/1998 | Van Huben | G06F 17/30557 |
| 6,606,566 | B1 | | 8/2003 | Sunshine | |
| 6,751,583 | B1 | * | 6/2004 | Clarke | G06F 17/5022 703/17 |
| 8,239,840 | B1 | | 8/2012 | Czymontek | |

(Continued)

FOREIGN PATENT DOCUMENTS

WO WO-2011017327 A1 2/2011

OTHER PUBLICATIONS

Extended European Search Report received in EP Application No. 13888381.4, dated Nov. 3, 2016, 9 pages.
International Search Report and Written Opinion, Mar. 27, 2014, PCT Patent Application No. PCT/US2013/048567, 10 pages.
Muccini, H. et al.; Software Testing of Mobile Applications: Challenges and Future Research Directions; http://ieeexplore.ieee.org/xpl/articleDetails.jsp?reload=true&arnumber=6228987> on pp. 29-35; Jun. 3, 2012.
Gorilla Logic, "Monkey Talk is here", posted Mar. 6, 2012, retrieved from the Internet on Sep. 5, 2018, 6 pages. <https://gorillalogic.com/blog/monkeytalk-is-here/>.

(Continued)

*Primary Examiner* — Bryce P Bonzo
*Assistant Examiner* — Jeison C Arcos

(57) ABSTRACT

Simulating sensors can include hooking an application associated with sensory data and associating the sensory data with an automation instruction. Simulating sensors can include providing the sensory data to a support device having an ability to modify the application and automatically causing the support device to simulate a sensory input using the sensory data by executing the automation instruction.

17 Claims, 4 Drawing Sheets

(56) References Cited

U.S. PATENT DOCUMENTS

| | | | |
|---|---|---|---|
| 8,690,325 B1* | 4/2014 | Straus | A61B 5/1171 349/12 |
| 2003/0177282 A1* | 9/2003 | Hejlsberg | G06F 9/54 719/328 |
| 2004/0205700 A1 | 10/2004 | Leu et al. | |
| 2004/0236820 A1* | 11/2004 | Flocken | G06F 11/0709 709/200 |
| 2007/0168744 A1* | 7/2007 | Pal | G06F 11/3688 714/38.1 |
| 2008/0244062 A1 | 10/2008 | Elangovan et al. | |
| 2010/0097336 A1 | 4/2010 | Gomes et al. | |
| 2011/0161912 A1 | 6/2011 | Eteminan et al. | |
| 2012/0130702 A1 | 5/2012 | Citron et al. | |
| 2012/0173490 A1* | 7/2012 | Gould | G06F 11/1474 707/648 |
| 2012/0221317 A1 | 8/2012 | Hwang | |
| 2012/0317555 A1* | 12/2012 | Aluru | G06F 17/5022 717/134 |
| 2013/0262349 A1* | 10/2013 | Bouqata | G06N 99/005 706/12 |
| 2014/0068569 A1* | 3/2014 | Goldin | G06F 8/73 717/130 |
| 2014/0082419 A1* | 3/2014 | Untinen | H04L 43/18 714/27 |
| 2015/0217449 A1* | 8/2015 | Meier | B25J 9/1602 700/257 |
| 2016/0075034 A1* | 3/2016 | Laurent | H04L 12/282 700/264 |
| 2016/0092248 A1* | 3/2016 | Shani | G06F 11/30 718/1 |
| 2017/0161175 A1* | 6/2017 | Aluru | G06F 11/3664 |

OTHER PUBLICATIONS

Keynote DeviceAnywhere, "Mobile Application Testing and Lifecycle Management", 2012. Retrieved from the Internet on Sep. 5, 2018, 2 pages <https://web.archive.org/web/20120214095032/http://www.keynotedeviceanywhere.com/mobile-application-testing-overview.html>.

Perfecto Mobile, "The Cloud-based Platform for Continuous Testing in a DevOps Environment", Retrieved from the Internet on Sep. 5, 2018, 8 pages. <http://www.perfecto.io/>.

Progress Telerik, "Test Studio Mobile", retrieved from the Internet on Sep. 5, 2018, 2 pages. <https://www.telerik.com/teststudio/mobile-testing>.

Soasta, "Mobile Testing Automation", retrieved from the Internet on Sep. 5, 2018, 3 pages. <https://web.archive.org/web/2012071507465/http://www.soasta.com/testing-solutions/mobile-application-testing/>.

Diewald, et al., "Towards a Holistic Approach for Mobile Application Development in Intelligent Environments", 2011, 8 pages.

* cited by examiner

SIMULATING SENSORS

CROSS-REFERENCE TO RELATED APPLICATION

This application is a U.S. National Stage Application of and claims priority to international Patent Application No. PCT/US2013/048567, filed on Jun. 28, 2013, and entitled "SIMULATING SENSORS".

BACKGROUND

Business processes may be a factor in the operational success of an organization. The business processes may be implemented using applications. As such, the organization may have an interest in ensuring that the applications operate properly (e.g., as intended). Therefore, the organization may pursue evaluating and/or fixing problems associated with an application.

DETAILED DESCRIPTION

Figure 1:
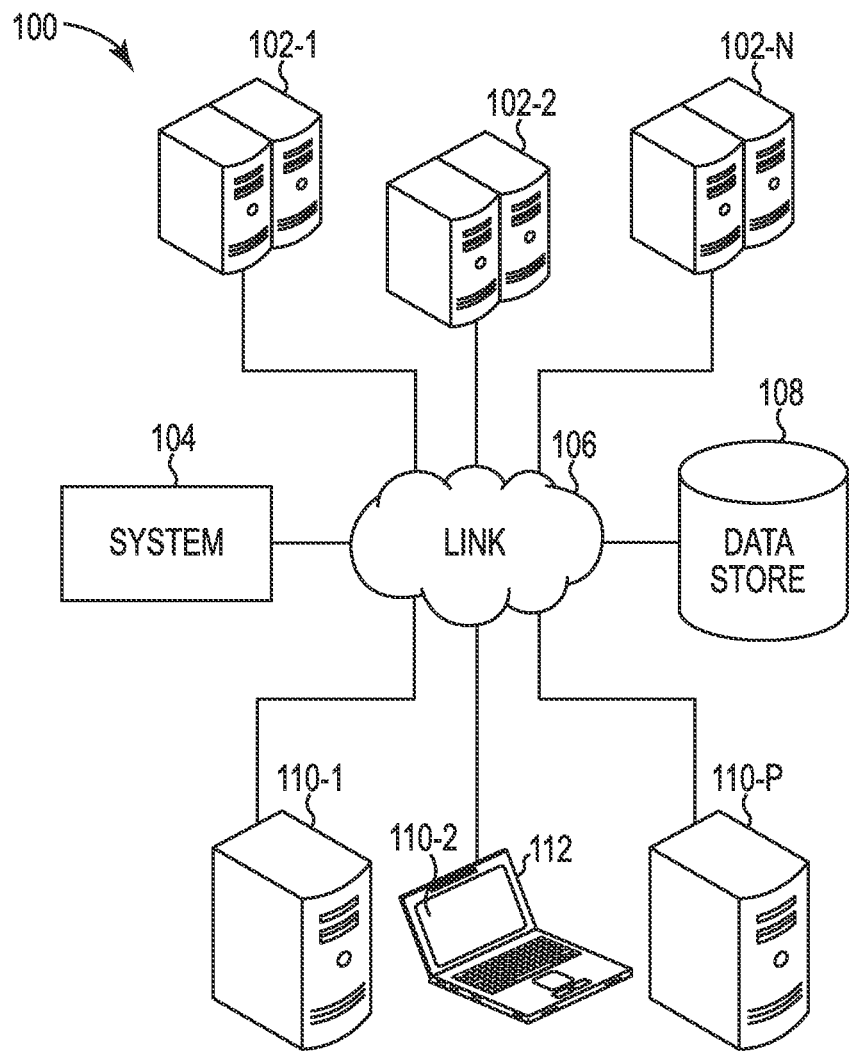
FIG. 1 illustrates an example of an environment in which various examples can be implemented for simulating sensors according to the present disclosure.

Applications, such as photography applications, video applications, location identifying applications, among others, can support business processes and/or be included in consumer products produced by the business processes. With increasing pressure on organizations to improve performance of their business processes (e.g., applications supporting the business processes), the organizations may seek to increase efficiencies, for instance, by pursuing efficient application testing. Application testing can include identification of and/or addressing issues.

An issue (e.g., an application issue) can refer to difficulties encountered when, for example, executing a particular function, such as a routine and/or task within a particular application. Functions can be executed by mobile devices. A mobile device refers to an electronic device including a sensor, for instance, a mobile phone, a digital camera, a payment instrument, etc. Sensors are electronic devices capable of capturing a sensory input (e.g., light, location, movement, cellular network traffic, etc.) and/or outputting sensory data. Sensory data refers to information (e.g., electronic data) representative of a sensory input. Examples of sensors include accelerometers, global positioning systems (GPS), microphones, communication antennas (e.g., cellular network antennas, Bluetooth antennas, etc.) gyroscopes, imaging sensors (e.g., cameras, video recorders, etc.), among others, that can be included in a mobile device and/or provide sensory data to applications supporting a business process.

A mobile device may include an application that may utilize sensory data communicated from sensor (e.g., a GPS sensor) to perform a function (e.g., locating a nearest ATM). An issue, for example, with the application utilizing the sensory data may prohibit the application from functioning as intended (e.g., locating the nearest ATM). Accordingly, ensuring proper functionality of the application can be desirable. However, due to the diverse and complex nature of today's business processes application testing can be challenging, complex, and/or costly.

However, simulating sensors can assist in application testing. Some previous techniques for simulating sensors may rely upon simulations performed in a live environment (e.g., a user environment) and/or a user manually operating a mobile device and/or sensor. However, such approaches have proven to be complex and/or costly, among other inefficiencies. Additionally, such approaches may not reproduce (or accurately reproduce) an issue. For example, attempting application testing in a live environment may not consistently replicate a sensory input (e.g., cellular network traffic) captured by the sensor (e.g., cellular network antenna) at a time and/or location associated with an issue (e.g., as originally identified) and/or may not capture the sensory input as intended for purposes of a given application test. Such reproduction difficulties can be compounded when operating a mobile device in a cloud environment. For instance, when operating in a cloud environment, a sensor (e.g., cellular network antenna) of the mobile device may be rendered ineffective due to limitations of the mobile device and/or operational constraints place on a mobile device by those facilitating the cloud environment.

In contrast, examples of the present disclosure include methods, systems, and computer-readable and executable instructions for simulating sensors. Simulating sensors refers to hooking an application associated with sensory data, associating the sensory data with an automation instruction, providing the automation instruction to a support device having an ability to modify the application, and automatically causing the support device to simulate a sensory input using the sensory data by executing the automation instruction.

Such sensor simulation can be performed in a support environment. As described herein, a support environment refers to an environment that can enable support personnel (e.g., an application developer) to modify an application, for instance, based upon simulating a sensor in the support environment. Stored sensory data related to an issue associated with an application can be accessed by a support device and/or real-time sensory data can be captured and provided to a support device. A support device can refer to an electronic device having the ability to modify the application and simulate a sensor using the stored sensory data and/or real-time sensory data, among other abilities. For a sensory input to be simulated, a support device (e.g., a support device located in a support environment) can be caused to simulate a sensory input using the sensory data (e.g., recorded sensory data) by executing an automation instruction, as described herein.

A live environment refers to an environment including a sensor capable of capturing a sensory input as sensory data. The sensor can be included in a mobile device and/or can operate as a stand alone sensor. The live environment is separate and distinct from the support environment. As described herein, being separate and distinct refers to an environment being physically separate and/or having separate network resources (e.g., network resources to create network traffic) with respect to another network. In this manner, applications can be tested (e.g., debugged) using sensory data captured from an actual sensor (e.g., in a mobile device located in the live environment), thereby avoiding the complications and expense (e.g., expenses associated with having each mobile device and/or sensor in a live environment in the support environment as well), among other advantages. However, the present disclosure is not so limited. That is, the sensory data can be stored in a data store and/or accessed at a later time for application testing.

In various examples, automation instructions (e.g., an automation script) can be utilized to automatically cause the support device to simulate the sensory input. That is, such a simulation can be accomplished without an input (e.g., mouse clicks, audio inputs, tactile inputs, etc.) from a user in contrast to traditional simulations that may be initiated following inputs provided by a user (e.g., via a graphical user interface). Simulating sensors without reliance on availability of such an input (e.g., a user to provide the input) can promote consistent, effective, and/or efficient application testing.

An issue can be determined by those supporting an application (e.g., a developer of an application and/or an IT administrator) and/or by those using the application in a live environment. An issue can be based on a service level agreement (SLA), and/or determined automatically (e.g., by a business service module (BSM)), among other ways to determine an issue. In some examples, additional advantages can be realized by integration of such methods, systems, and computer-readable and executable instructions with a performance monitoring solution, for example, the BSM. The BSM refers to instructions and/or hardware capable of performing functions including issue determination, data analysis, and/or manipulation of data, among other functions. The BSM can be coupled to an engine, such as those described herein. Such integration can facilitate automatic detection of the issues and/or automatic capturing of sensory data (e.g., upon determination of an issue).

In the following detailed description of the present disclosure, reference is made to the accompanying drawings that form a part hereof, and in which is shown by way of illustration how examples of the present disclosure can be practiced. These examples are described in sufficient detail to enable those of ordinary skill in the art to practice the examples of this disclosure, and it is to be understood that other examples can be utilized and that process, electrical, and/or structural changes can be made without departing from the scope of the present disclosure.

As will be appreciated, elements shown in the various examples herein can be added, exchanged, and/or eliminated so as to provide a number of additional examples of the present disclosure. In addition, the proportion and the relative scale of the elements provided in the figures are intended to illustrate the examples of the present disclosure, and should not be taken in a limiting sense. As used herein, "a number of" an element and/or feature can refer to one or more of such elements and/or features. In addition, "for example" and similar phrasing is intended to mean, "by way of example and not by way of limitation".

FIG. 1 illustrates an example of an environment in which various examples can be implemented for simulating sensors according to the present disclosure. The environment 100 is shown to include a system 104 to simulate sensors, mobile devices 102-1, 102-2, . . . , 102-N, support devices 110-1, 110-2, . . . , 110-P, a data store 108, and a link 106. The data store 108 can be analogous to those discussed with respect to FIG. 3A. The system 104 can include a computing device analogous to that discussed with respect to FIG. 3B. The mobile devices 102-1, . . . , 102-N, as described herein, can be a computing device (e.g., an electronic device) including a sensor.

The support devices 110-1, . . . , 110-P represent computing devices to access sensory data (e.g., electronic data) having browsers and/or other applications to communicate such sensory data, modify applications, and/or simulate a sensory input using the recorded sensory data by executing an automation instruction. The support devices 110-1, . . . , 110-P can include can include a digital display such as a graphical user interface (GUI) 112. Similarly, in some examples, the mobile devices 102-1, . . . , 102-N can include a digital display (not shown) suitable for display of electronic data.

A user interface can include hardware components and/or computer-readable instruction components. For instance, hardware components can include input components (e.g., a mouse, a touch screen, and a keyboard) and/or output components (e.g., a display). An example user interface can include a GUI. A GUI can, for example, digitally represent a simulated sensory input. That is, in some examples, sensory data can be displayed by a user interface of a support device. Such displays can facilitate interactions between a user and a computer (e.g., allows a user to interact with a computer using images and/or text). For example, a simulated sensory input (e.g., light arranged as a photo) can be displayed to promote verification of the simulated sensory input. Verification can include visual verification (e.g., that the sensory input is simulated as intended by a user) and/or automatic verification, as described herein.

Link 106 (e.g., a network) represents a cable, wireless, fiber optic, or remote connection via a telecommunication link, an infrared link, a radio frequency link, and/or other connectors or systems that provide electronic communication. That is, the link 106 can, for example, include a link to an intranet, the Internet, or a combination of both, among other communication interfaces. The link 106 can also include intermediate proxies, for example, an intermediate proxy server (not shown), routers, switches, load balancers, and the like.

The system 104 for simulating sensors, as described herein, can represent different combinations of hardware and instructions to simulate sensors. The system 104 for simulating sensors can include a computing device (not shown), for instance, computing device 355 as discussed with respect to FIG. 3B.

The computing device can include instructions for hooking an application such as those described herein. Hooking refers to various techniques to monitor, alter, and/or otherwise gain control of an application. For example, function calls, messages, and/or network traffic to/from an application can be intercepted and/or copied by hooking. Hooking an application can include physical modification (e.g., injecting of a library including executable instructions for hooking into the application prior to the application executing) and/or runtime modification of the application (injection executable instructions for hooking in the application during runtime of an operating system and/or during execution of functions of the application). Such instructions (e.g., libraries of executable instructions) can be removed (e.g., prior to introduction of the application into a live environment) to provide a user with an application having original instructions (e.g., without the instructions/library for hooking).

In some examples, an application executing on a proprietary operating system (OS) can be hooked. That is, hooking can refer to hooking of a suitable type of OS, type of instruction(s) (e.g., JavaScript, C#, etc.), and/or application type (e.g., file type). Hooked applications can provide various types of data. For example, an application (e.g., a photography application) can employ a sensor to capture a sensory input (e.g., light) as sensory data. Such sensory data can be recorded by hooking the application. For instance, a function (e.g., a function call) of an application that is associated with a sensor (e.g., calls the sensor) can be hooked to record information (e.g., all information) the sensor sends to/receives from the application. Recording refers to storing data (e.g., sensory data). The recorded data can be stored along with information (e.g., metadata) associated therewith. Such information can include a time of generation of the sensory data, the application associated with the sensory data, an application function that called the sensory data to be generated, and/or a sensor that captured that sensory data, among other information to promote simulating sensors. Such information can be stored in a data store (e.g., such as data store 108 as discussed with respect to FIG. 1). Such hooking can be particularly useful for a developer of an application who wishes to debug the application (e.g., an application in a live environment).

In various examples, the sensory data and/or information associated therewith (e.g., an address of recorded sensory data) can be associated with an automation instruction. An automation instruction refers to an instruction to perform a given application function automatically (e.g., without a user input). Examples of automation instructions include user interface (UI) automation instructions and/or application programming interface (API) automation instructions, among other suitable types of automation instructions. Automation instructions can specify how an application can interact with other applications, sensors, data stores, etc. For instance, an automation instruction can include sensory data and/or a location associated with sensory data (e.g., a location of a data store where particular sensory data can be accessed). In some examples, a location associated with sensory data can be embedded in the automation instruction.

Automation instructions can, for example, execute various functions of a particular application. For example, a particular automation instruction can execute functions of a photography application such that each time the photography application tries to perform a function (e.g., initiates a function call) to take a photograph via a sensor the automation instruction can return previously captured sensory data (e.g., stored in a data store) rather than initiating a real time capture of sensory data by the sensor. Such simulation of a sensor can promote consistent, efficient, and/or effective testing of applications. Furthermore, such a simulation can be desirable for testing a particular application utilizing a sensor that is intended to provide sensory data to a mobile device that may not yet exist (e.g, a mobile device under development) and/or may not be available at a particular location associated with a test (e.g., a support environment).

Figure 2:
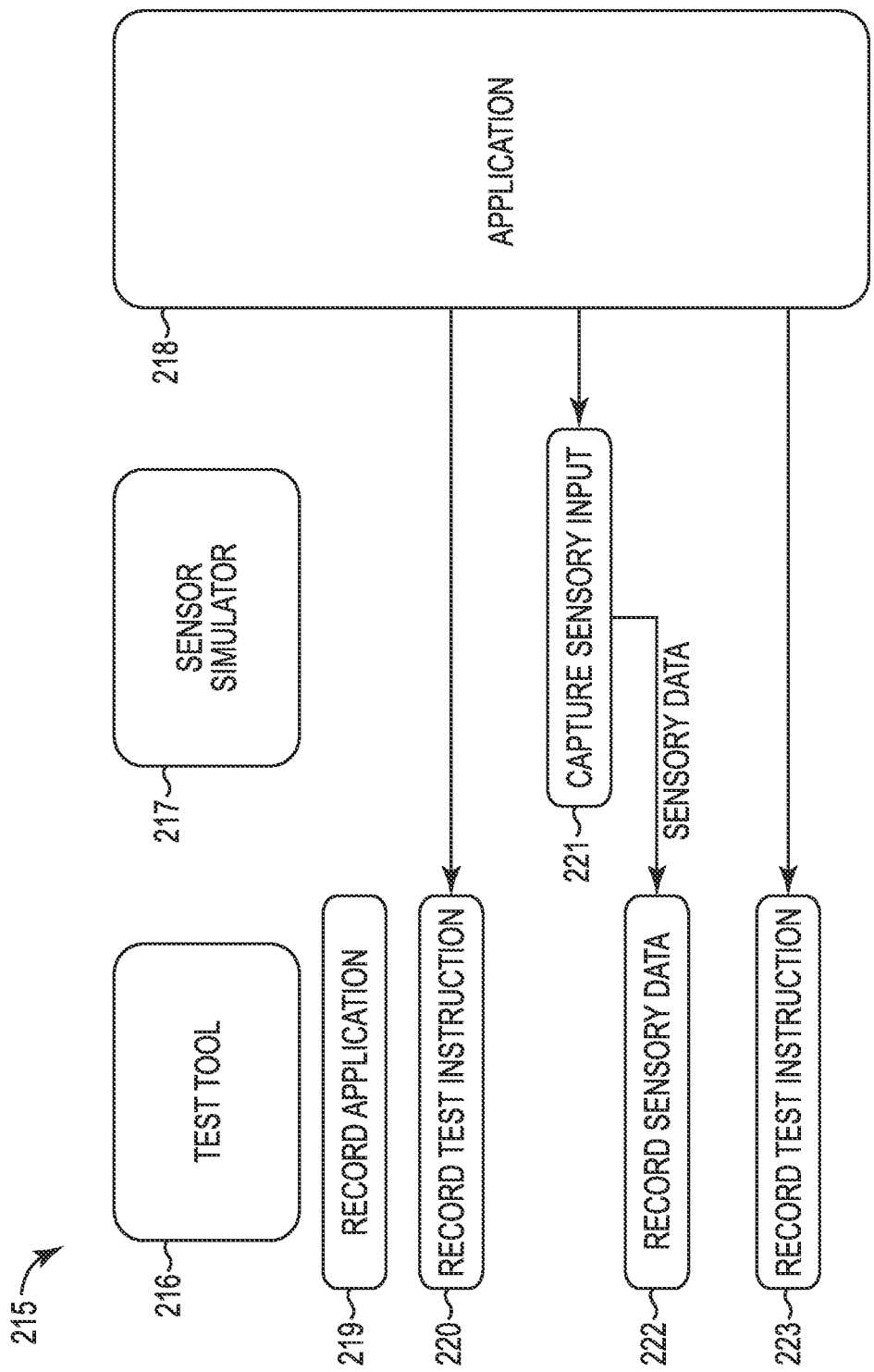
FIG. 2 illustrates an example of a flow diagram to record sensory data for simulating sensors according to the present disclosure.

FIG. 2 illustrates an example of a flow diagram to record sensory data for simulating sensors according to the present disclosure. As illustrated in FIG. 2, the example flow diagram 215 can include a test tool 216, a sensor simulator 217, and/or an application 218 (e.g., an application under test). The test tool 216 can perform a number of testing functions, such as, those described at 219, 220, 222, and/or 223, among testing functions. The sensor simulator 217 can perform a number of simulation functions, such as described at 221, among other simulation functions. The test tool 216 and the sensor simulator 217 can be included in a single device (e.g., a support device) and or distributed across multiple devices.

Further, test tool 216 can be fully or partially integrated in the same device as the sensor simulator 217 or it can be separate but accessible to that device and sensor simulator 217.

The test tool 216 can be used to record sensory data, as illustrated at 219. That is, the application can be hooked, as described herein, such that a function (e.g., a function call) of the application and/or information associated with the function can be intercepted and/or recorded.

The test tool 216 can include test instructions and/or receive test instructions (e.g., from a data store). Test instructions refer to instructions executable to test applications, such as testing functions of the application. The test instruction can be executed by the test tool 216 to test (e.g., automatically test) the application. For example, the test instructions can cause the application to request sensory data (e.g., from a sensor). Such a test instruction and/or information (e.g., metadata) associated therewith can be recorded, as illustrated at 220. For instance, an application including a function that the test instruction is capable of testing can be hooked to record the test instruction. Execution of the test instruction can include execution of an automation instruction. That is, the automation instruction can include instructions to automatically execute test instructions.

As illustrated at 221, a sensory input can be captured by a sensor as sensory data and/or the sensory data can be provided to the test tool 216 to be recorded, as shown at 222. In some examples, recording of the sensory data can be initiated in response to a test instruction. For example, the test instruction recorded at 220 can initiate recording of the sensory data. As illustrated at 223, similar to 220, the test tool 216 can record a test instruction. The test instruction can, for example, be a different test instruction (e.g., different compared to the test instruction recorded at 220).

Similarly, the test tool 216 and the sensor simulator 217 can be used to test an application using the simulated sensory input. In some examples, the sensory input can be simulated in response to a test instruction. For instance, a test instruction can be executed to send a request (e.g., a function call) to an application to test a function of an application. When the application receives the request, the application can perform a function (e.g., send a function call to a sensor). The function call sent by the application (e.g. sent with an intended recipient being a sensor) can be intercepted (e.g., by hooking the application). A sensory input can be simulated (e.g., simulated by the sensor simulator 217 using recorded sensory data representative of the sensory input). Such a simulated sensory input can be returned as a result of the intercepted function call sent from the application, rather than returning sensor data from the sensor. In some examples, the sensory input can be simulated in response to a test instruction and/or between test instructions. Such interweaving of a simulated sensory input in response to a test instruction can enable consistent, reliable, and effective testing (e.g., automatic testing) of applications.

Figure 3A:
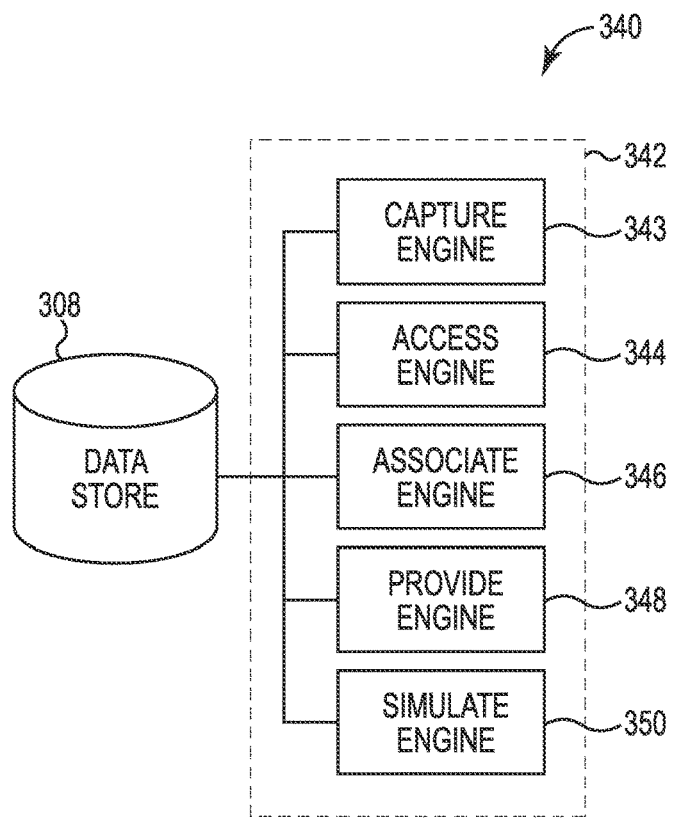
FIG. 3A illustrates a diagram of an example of a system for simulating sensors according to the present disclosure.

FIG. 3A illustrates a diagram of an example of a system 340 for simulating sensors according to the present disclosure. The system 340 can include a data store 308 (e.g., analogous to data store 108 as referenced in FIG. 1), a simulating system 342, and/or a number of engines. The simulating system 342 can be in communication with the data store 308. The simulating system 342 can include a number of engines (e.g., capture engine 343, access engine 344, associate engine 346, provide engine 348, simulate engine 350, etc.). The simulating system 342 can include additional or fewer engines than illustrated to perform the various functions described herein.

The number of engines can include a combination of hardware and programming to perform a number of functions described herein (e.g., accessing and/or recording sensory data, etc.). Each of the engines can include hardware or a combination of hardware and programming designated or designed to execute a module (e.g., a particular module). The programming can include instructions (e.g., software, firmware, etc.) stored in a memory resource (e.g., computer-readable medium) as well as a hard-wired program (e.g., logic).

The capture engine 343 can include hardware and/or a combination of hardware and programming to capture a sensory input as sensory data. Capturing can include transformation of a sensory input (e.g., light) into sensory data (e.g., electronic data) representative of the sensory input. The capture engine can include a sensor, such as those as described herein.

The access engine 344 can include hardware and/or a combination of hardware and programming to record the sensory data, for instance, by hooking an application associated with the sensory data. Recording the sensory data can include recording the sensor data into storage (e.g., a data store). Such recording be include recording the sensory data and/or information (e.g., metadata) associated with the sensory data, for instance, a time of generation of the sensory data, among other information to promoting simulating sensors. In some examples, the access engine 344 can record the sensory data by hooking an application including a proprietary operating system, as described herein.

In some examples, the access engine 344 can access sensory data, for example, by hooking the application associated with the sensory data (e.g., the recorded sensory data). Accessing the sensory data can include accessing existing sensory data (e.g., previously captured and recorded in the data store 108) and/or discovery of newly captured (e.g., real-time) sensory data (e.g., by a sensor and subsequently stored in the data store 108). Capturing and/or accessing (e.g., recording) of sensory data can occur periodically (e.g., at a regularly occurring time and/or time intervals), upon request (e.g., initiated by an IT administrator), or upon an unexpected occurrence of an event (e.g., a deviation from a performance standard, such as those specified by a SLA).

The associate engine 346 can include hardware and/or a combination of hardware and programming to associate the sensory data (e.g., recorded sensory data) with an automation instruction (e.g., UI and/or API) associated with the application. For example, association can include embedding an address of a data store storing the sensory data (e.g., recorded sensory data) in the automation instruction. In such an example, the automation instruction can, when executed, cause the sensory data to be accessed (e.g., retrieved from the data store).

The provide engine 348 can include hardware and/or a combination of hardware and programming to provide the automation instruction to a support device having an ability to modify the application. For example, executable instructions (e.g., libraries of executable instructions) and/or hardware can be provided to the support devices. Such instructions can include automation instructions and/or sensory data. Sensory data can be provided directly and/or indirectly. Providing sensory data directly refers to including the sensory data directly in an automation instruction. Providing the sensory data indirectly can, for example, refer to providing an address (e.g., including a location) of the sensory data. For example, an address of the sensory data can be embedded in the automation instruction In some examples, the provide engine 348 can provide test instructions, such as those discussed with respect to FIG. 2, The simulate engine 350 can include hardware and/or a combination of hardware and programming to automatically cause the support device to simulate the sensory input using the recorded sensory data by executing the automation instruction. Causing (e.g., automatically causing) a display can include executing instructions stored in memory to directly cause a support device to display, for example, a simulated sensory input and/or to communicate data with an expectation that it be processed by another device to cause the support device to display the simulated sensory input. The sensory input can, in some examples, be simulated in response to a test instruction (e.g., execution of a test instruction), such as those as discussed with respect to FIG. 2. In some examples, simulating the sensory input (e.g., causing a display of the simulated sensory input) can include simulating the sensory input without user input.

In some examples, the simulate engine 350 can include executable instructions to implement the simulate engine 350 to verify the simulated sensory input, for example, by causing (e.g., automatically causing) a support device to display the simulated sensory input. Such a display can readily enable a user to test an application and/or verify the simulated sensory input. Verifying can include verifying an occurrence of the simulated sensory input and/or verifying conformance with a standard (e.g., a performance standard). Examples of such a standard can include, a desired response times (e.g., web page load times) and/or a desired quality of simulation (e.g., resolution, time to completion of simulation, etc.), among others. Such verification can be performed by a user (e.g., by a user via a GUI) based upon an SLA and/or automatically (e.g., by a BSM). Accordingly, in some examples, the simulate engine 350 can include instructions to provide the simulated sensory input to a BSM having an ability to verify the simulated sensory input (e.g., that an application has caused a user account to be added and/or turn on a Wi-Fi antenna, etc.).

Figure 3B:
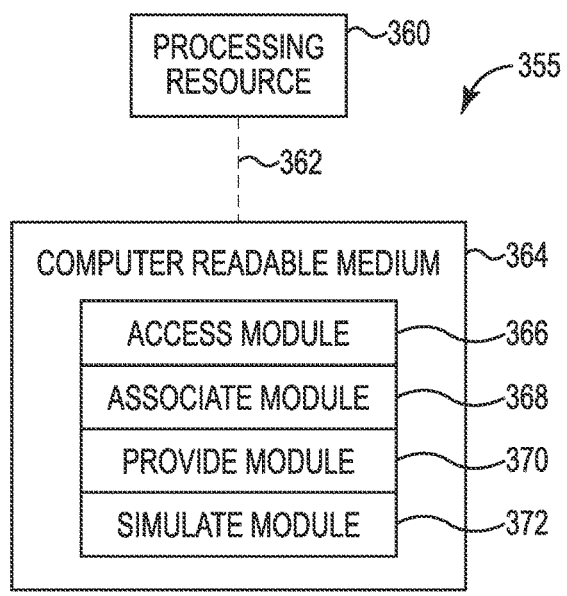
FIG. 3B illustrates a diagram of an example of a computing device for simulating sensors according to the present disclosure.

FIG. 3B illustrates a diagram of an example of a computing device for simulating sensors according to the present disclosure. The computing device 355 can utilize software, hardware, firmware, and/or logic to perform a number of functions described herein.

The computing device 355 can be a combination of hardware and instructions to share information. The hardware, for example can include a processing resource 360 and/or a memory resource 364 (e.g., computer-readable medium (CRM), database, etc.) A processing resource 360, as used herein, can include a number of processors capable of executing instructions stored by a memory resource 364. Processing resource 360 can be integrated in a single device or distributed across multiple devices. The instructions (e.g., computer-readable instructions (CRI)) can include instructions stored on the memory resource 364 and executable by the processing resource 360 to implement a desired function (e.g., simulate a sensory input, etc.).

The memory resource 364 can be in communication with a processing resource 360. A memory resource 364, as used herein, can include a number of memory components capable of storing instructions that can be executed by processing resource 360. Such memory resource 364 can be a non-transitory CRM. Memory resource 364 can be integrated in a single device or distributed across multiple devices. Further, memory resource 364 can be fully or partially integrated in the same device as processing resource 360 or it can be separate but accessible to that device and processing resource 360. Thus, it is noted that the computing device 355 can be implemented on a support device and/or a collection of support devices, on a mobile device and/or a collection of mobile devices, and/or on a combination of the support devices and the mobile devices.

The memory resource 364 can be in communication with the processing resource 360 via a communication link (e.g., path) 362. The communication link 362 can be local or remote to a computing device associated with the processing resource 360. Examples of a local communication link 362 can include an electronic bus internal to a computing device where the memory resource 364 is one of volatile, non-volatile, fixed, and/or removable storage medium in communication with the processing resource 360 via the electronic bus.

The memory resource 364 can include a number of modules such as an access module 366, an associate module 368, a provide module 370, and a simulate module 372. The number of modules 366, 368, 370, 372 can include CRI that when executed by the processing resource 360 can perform a number of functions. The number of modules 366, 368, 370, 372 can be sub-modules of other modules. For example, the access module 366 and the associate module 368 can be sub-modules and/or contained within the same computing device. In another example, the number of modules 366, 368, 370, 372 can comprise individual modules at separate and distinct locations (e.g., CRM, etc.).

Each of the number of modules 366, 368, 370, 372 can include instructions that when executed by the processing resource 360 can function as a corresponding engine as described herein. For example, the simulate module 372 can include instructions that when executed by the processing resource 360 can function as the simulate engine 350. For instance, the simulate module 372 can include CRI that when executed by the processing resource 360 can automatically cause the support device to simulate a sensory input using the sensory data by executing the automation instruction.

Figure 4:
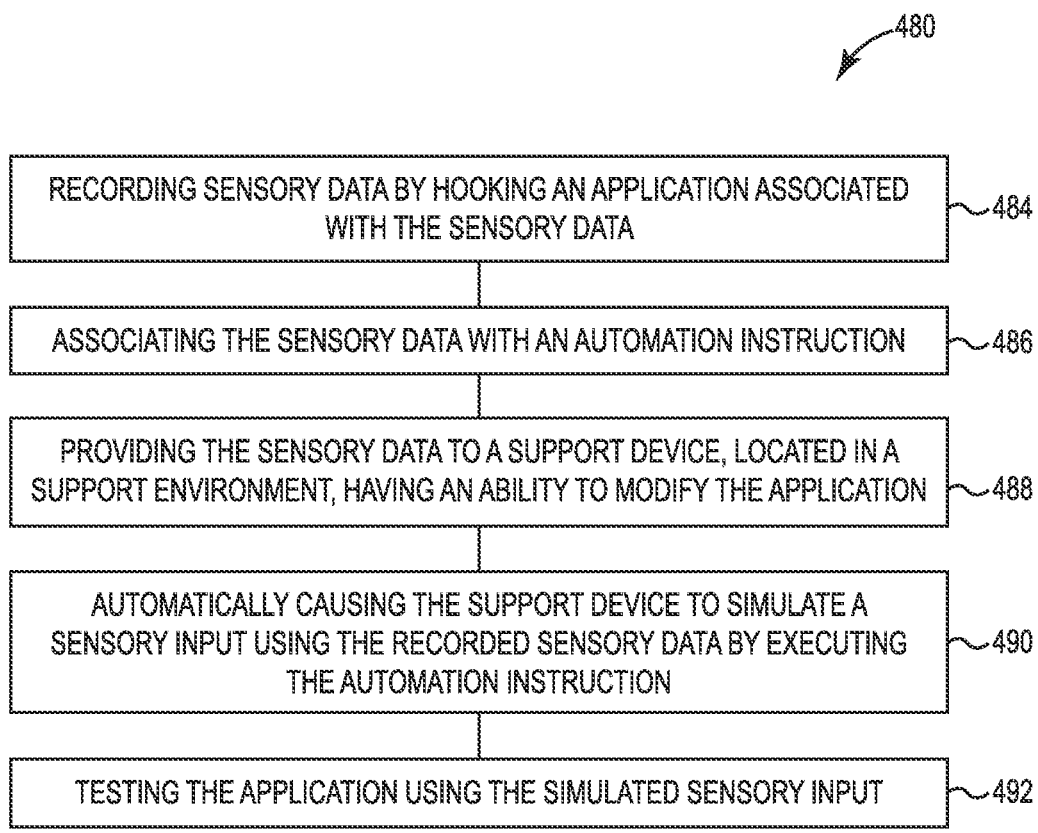
FIG. 4 illustrates a flow diagram of an example of a method for simulating sensors according to the present disclosure.

FIG. 4 illustrates a flow diagram of an example of a method for simulating sensors according to the present disclosure. As shown at block 484, in various examples, the method 480 can include recording sensory data by hooking an application associated with the sensory data. Recording can include executing instructions stored in memory to record sensory data by hooking an application associated with the sensory data. Similarly, blocks 486, and 488, 490, and 492 can include executing instructions stored in memory to perform the examples of the method described therein.

As shown at block 486, the method 480 can include associating the sensory data with an automation instruction. Associating refers to including information in an automation instruction that associates sensory data (e.g., corresponding to sensory data obtainable by a given function of an application) with an automation instruction. In some examples, associating the sensory data with an automation instruction can include embedding an address of a data store within an automation instruction. That is, the address can correspond to a data store including recorded sensory data that the automation instruction can call when executed. In some examples, some or all of the recorded sensory data can be included within the automation instruction.

As shown at block 488, in various examples, the method 480 can include providing the sensory data to a support device having the ability to modify the application. For example, the sensory data can be provided to a support device located in a support environment. The support device can modify the application to address (e.g., resolve) an issue.

The method can, in some examples, include modifying the application based on a simulated sensory input (e.g., a simulated sensory input used to identify an issue). Such modification (e.g., debugging) can include modifying the executable code and/or settings associated with the application, for example data store and/or sensor selection (e.g., those utilized by an application), among other settings associated with the application. In some examples, the modified code and/or modified settings can, for example, replace previous code and/or previous settings. For instance, in some examples, instructions can be provided to the mobile device to modify settings associated with the mobile device in response to the issue being identified (e.g., by the support personnel) to be related to the settings associated with the user device. The modified code and/or the modified settings can be stored, for example, as a set of instructions in a computer-readable medium. However, the disclosure is not so limited. That is, the modification can include modifying a component, such as a sensor, directly or indirectly associated with the application that is suitable to address the issue.

As shown at block 490, in various examples, the method 480 can include automatically causing the support device to simulate the sensory input using the recorded sensory data by executing the automation instruction. In some examples, the method can include causing the support device to simulate the issue using the sensory data in response to receiving the sensory data at the support device in a support environment that is separate and distinct from a live environment, as described herein.

In some examples, the method can include verifying the simulated sensory input. Such verification can, in some examples, include causing the support device to display the simulated sensory input. A quality (e.g., a particular resolution), the presence (e.g., a complete simulation), and/or quantity (e.g., duplicates) of a particular simulated sensory input can be verified, for example, based on the displayed simulated sensory input. Such verification can be performed by a user (e.g., by a user via a GUI), be based upon an SLA, and/or be performed automatically (e.g., by a BSM).

Each automation instruction can include a related verification instruction. For example, an automation instruction to add a user based upon a sensory input can include a verification to ensure the user was added. Such verification can include verifying without further interaction with the application (e.g., without executing instructions additional to those executed to cause the simulated sensory input). For example, visual verification that a total number of users increased in response to the automation instruction adding the user). Similarly, an automation instruction to turn on a Wi-Fi antennae can be verified by visually observing if a Wi-Fi icon indicating the Wi-Fi has been switched on by the automation instruction is activated (e.g., illuminated).

In some examples, verifying can include creating a checkpoint (e.g., at a point in time prior to completion of the entire sensory input) to verifying occurrence of a portion of the simulated sensory input (e.g., that the portion of the simulated sensory output is an expected). For example, simulation of a given input, such as an amount of light corresponding to a given photo taken by a photography application, a checkpoint can correspond to a percent of completion of the overall amount of the given input and/or can correspond to execution of a particular function/act (e.g., sizing, image enhancing, etc.) utilized by the application.

As shown at block 492, in various examples, the method 480 can include testing the application using the simulated sensory input. Such testing can include executing test instructions and/or simulating a sensory input (e.g., in response to a test instruction), such as those as discussed with respect to FIG. 2.

As used herein, "logic" is an alternative or additional processing resource to execute the actions and/or functions, etc., described herein, which includes hardware (e.g., various forms of transistor logic, application specific integrated circuits (ASICs), etc.), as opposed to computer executable instructions (e.g., software, firmware, etc.) stored in memory and executable by a processing resource.

The figures herein follow a numbering convention in which the first digit or digits correspond to the drawing figure number and the remaining digits identify an element or component in the drawing. Similar elements or components between different figures may be identified by the use of similar digits. For example, 108 may reference element "08" in FIG. 1, and a similar element may be referenced as 308 in FIG. 3.

The specification examples provide a description of the applications and use of the system and method of the present disclosure. Since many examples can be made without departing from the spirit and scope of the system and method of the present disclosure, this specification sets forth some of the many possible example configurations and implementations.

What is claimed:

1. A non-transitory computer-readable medium storing a set of instructions executable by a processing resource to:
   access sensory data from an application by hooking the application to record the sensory data by the application;
   associate the sensory data with an automation instruction;
   provide the automation instruction to a support device having an ability to perform a modification on the application, wherein the modification includes modifying a setting or executable code of the application;
   automatically cause the support device to perform the modification on the application; and
   automatically cause the support device to simulate a sensory input on the modified application using the sensory data by executing the automation instruction to cause the modified application to perform a function based on the simulated sensory input.

2. The medium of claim 1, wherein the instructions include instructions executable by the processing resource to test the modified application using the simulated sensory input.

3. The medium of claim 1, wherein the instructions to access the sensory data include instructions executable by the processing resource to access sensory data recorded by hooking an application executing on a proprietary operating system.

4. The medium of claim 1, wherein the instructions include instructions executable by the processing resource to verify the simulated sensory input.

5. The medium of claim 4, wherein the instructions to verify include instructions executable by the processing resource to provide the sensory data to a business services module having an ability to automatically verify the simulated sensory input.

6. The medium of claim 1, wherein the instructions to simulate the sensory input include instructions executable by the processing resource to simulate the sensory input without user input.

7. A system, comprising a processing resource in communication with a non-transitory computer-readable medium having instructions executable by the processing resource to implement:
   a capture engine to capture a sensory input as sensory data;
   an access engine to record the sensory data by hooking the application to record the sensory input by the application;
   an associate engine to associate the sensory data with an automation instruction associated with the application;
   a provide engine to provide the automation instruction to a support device having an ability to perform a modification on the application, wherein the modification includes modifying a setting or executable code of the application;
   a perform engine to automatically cause the support device to perform the modification on the application; and
   a simulate engine to automatically cause the support device to simulate the sensory input on the modified application using the recorded sensory data by executing the automation instruction to cause the modified application to perform a function based on the simulated sensory input.

8. The system of claim 7, wherein the instructions to implement the simulate engine to simulate the sensory input include instructions executable by the processing resource to implement the simulate engine to simulate the sensory input in response to execution of a test instruction to test the modified application.

9. The system of claim 7, wherein the instructions to implement the access engine to record the sensory data include instructions executable by the processing resource to record the sensory data in a data store and instructions executable by the processing resource to implement the access engine to access the sensory data from the data store.

10. The system of claim 7, wherein the instructions include instructions executable by the processing resource to implement the provide engine to provide the recorded sensory data to the support device.

11. The system of claim 7, wherein the instructions to implement the capture engine to capture the sensory input include instructions executable by the processing resource to implement the capture engine to capture the sensory input from a sensor located in a live environment that is separate and distinct from a support environment including the support device.

12. A method for simulating sensors, comprising:
   recording sensory data from an application by hooking the application to record the sensory data by the application;
   associating the sensory data with an automation instruction;
   providing the sensory data to a support device, located in a support environment, having an ability to perform a modification on the application, wherein the modification includes modifying a setting or executable code of the application;
   automatically cause the support device to perform the modification on the application; and
   automatically causing the support device to simulate a sensory input on the modified application using the recorded sensory data by executing the automation instruction to cause the modified application to perform a function based on the simulated sensory input.

13. The method of claim 12, wherein associating the sensory data with the automation instruction includes embedding, in the automation instruction, an address of a data store storing the recorded sensory data.

14. The method of claim 12, wherein the method includes modifying the application based on the simulated sensory input.

15. The method of claim 12, wherein the method includes verifying the simulated sensory input by causing the support device to display an electronic representation of the simulated sensory input.

16. The medium of claim 1, wherein the instructions to associate the sensory data with an automation instruction comprise instructions to embed, in the automation instruction, an address of a data store storing the recorded sensory data.

17. The system of claim 7, wherein to associate the sensory data with an automation instruction, the associate engine is to embed, in the automation instruction, an address of a data store storing the recorded sensory data.

* * * * *